United States Patent [19]

Allcock et al.

[11] 4,444,972

[45] Apr. 24, 1984

[54] CARBORANYLMETHYLENE-SUBSTITUTED PHOSPHAZENES AND POLYMERS THEREOF

[75] Inventors: Harry R. Allcock, State College; Angelo G. Scopelianos, Secane, both of Pa.

[73] Assignee: The United States of America as represented by the Administrator of the National Aeronautics and Space Administration, Washington, D.C.

[21] Appl. No.: 491,125

[22] Filed: May 3, 1983

[51] Int. Cl.$^3$ .................. C08G 79/04; C08G 79/08
[52] U.S. Cl. .................. 528/6; 525/389; 528/7; 528/394; 528/399; 568/4; 568/5
[58] Field of Search .................. 568/4, 5; 528/6, 7, 528/394, 399; 525/389

[56] References Cited

U.S. PATENT DOCUMENTS 4,276,403 6/1981 Frosch et al. .................. 528/6
4,288,585 9/1981 Frosch et al. .................. 528/6

OTHER PUBLICATIONS

Heat-Resistant Polyphosphazene Polymers, NASA Tech Briefs, Fall 1980.
The Synthesis and Study of Carborane-Containing Polyphosphazenes, Korshak et al., Polymer Science USSR, vol. 22, No. 9, pp. 2180–2187 (1980).

Primary Examiner—Lester L. Lee
Attorney, Agent, or Firm—Darrell G. Brekke; John R. Manning

[57] ABSTRACT

Carboranylmethylene-substituted cyclophosphazenes which can be thermally polymerized into carboranylmethylene-substituted phosphazene polymers, useful as thermally stable coatings and, due to the characteristics of these polymers in acting as a ligand for transition metals, metallocarboranylmethylene phosphazene polymers which can act as immobilized catalyst systems, and are electrically conductive and superconductive.

12 Claims, 3 Drawing Figures

CARBORANYLMETHYLENE-SUBSTITUTED PHOSPHAZENES AND POLYMERS THEREOF

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

FIELD OF THE INVENTION

This invention relates to carboranylmethylene-substituted cyclophosphazenes which can be thermally polymerized into carboranylmethylene-substituted phosphazene polymers. More particularly, this invention relates to carboranylmethylene-substituted cyclophosphazenes, carboranylmethylene-substituted phosphazene polymers useful as thermally stable coatings and, due to the characteristics of these polymers in acting as a ligand for transition metals, to metallocarboranylmethylene phosphazene polymers which can act as immobilized catalyst systems, and are electrically conductive and superconductive.

BACKGROUND OF THE INVENTION

Complexes between a nido-carboranyl structures and transition metals are known. The synthesis of closo-carboranes linked through carbon-phosphorus bonds to both cyclic and high polymeric phosphazenes has been described. (See. A. G. Scopelianos et al., *Chem. Comm.* 1980, 198 and H. R. Allcock et al., *J. Am. Chem. Soc.,* 103, No. 2, 350–357 (1981)).

Further, hydridophosphazenes and various alkyl phosphazenes and the syntheses thereof using organocopper-phosphazene complexes and organometallic (copper, magnesium or lithium) phosphazenes are also described in the art (see H. R. Allcock et al., *J. Am. Chem. Soc.,* 101, 6221 (1979) and H. R. Allcock et al., *J. Am. Chem. Soc.,* 103, 2256 (1981)).

However, none of these known phosphazenes can be utilized to produce polymers in which metallocarboranyl groups are present giving rise to particularly interesting properties as high temperature, immobilized catalyst species or as polymers with unique electrical behavior due to the functioning of such phosphazene polymers as ligands for transition metals.

SUMMARY OF THE INVENTION

Accordingly, an object of this invention is to provide a cyclophosphazene substituted with a carboranylmethylene group useful as a starting material in the production of unique polymer systems.

A further object of this invention is to describe a method of synthesizing such a carboranylmethylene-substituted cyclophosphazene.

An even further object of this invention is to provide a class of phosphazene polymers which contain an appropriate structure permitting conversion of such a structure into metal-containing polymer systems whereby functional groups on the polymer act as ligands for transition metals.

An even further object of this invention is to provide a class of carboranylmethylene phosphazene polymers useful, upon complexation with various metals, of providing metallocarboranylmethylene-substituted phosphazene polymers useful as immobilized catalysts and as polymers with unusual catalyst, electrical conductivity and superconductivity properties.

Accordingly, in one embodiment of this invention, this invention provides, as a starting material for the production of such polymers, a carboranylmethylene-substituted cyclophosphazene of the formula (I)

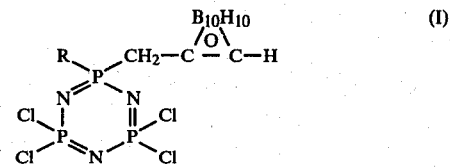

where R is $CH_3$, $C_2H_5$ or $n\text{-}C_3H_7$.

In a second embodiment of this invention, this invention provides a phosphazene polymer containing therein repeating units of the formula (II)

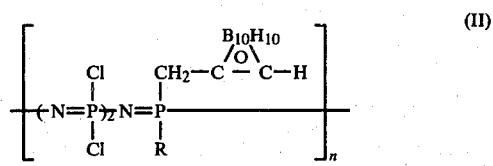

wherein R is as described above and n represents the degree of polymerization ranging from 500 to 5000.

An even further embodiment of this invention provides a rhodium complexed phosphazene polymer of the formula (III)

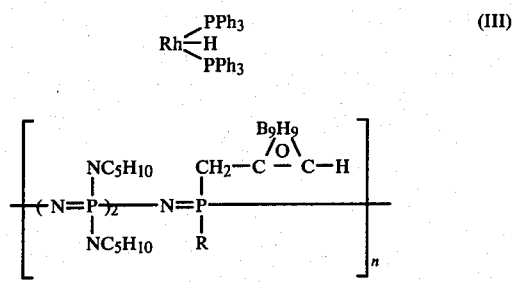

wherein R and n are as described above.

An additional embodiment of this invention provides metallocarboranylmethylene phosphazene polymers of the formula (IV)

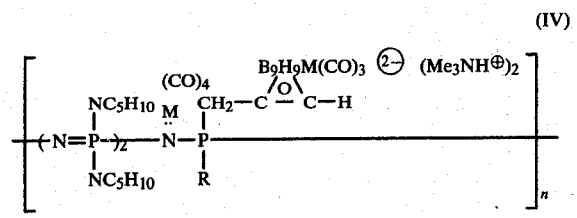

wherein R and n are as described above.

This invention in additional embodiments also relates to unique intermediates useful in the production of the cyclophosphazene of the formula (I) set forth above and further in the production of various carboranylmethylene phosphazene polymers of the formulas (II)–(IV) above.

BRIEF DESCRIPTION OF THE ACCOMPANYING DRAWINGS

FIGS. 1, 2 and 3 show the basic repeating unit of embodiments of phosphazene polymers of the present invention thermally polymerized from the carboranylmethylene-substituted cyclophosphazene of the formula (I) described above.

DETAILED DESCRIPTION OF THE INVENTION

Figure 1:
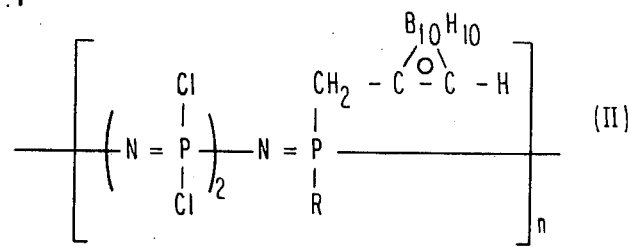
Figure 2:
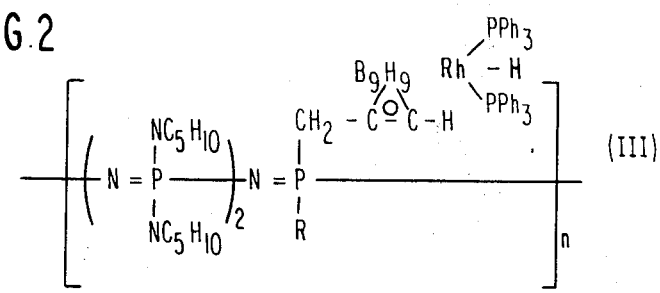
Figure 3:
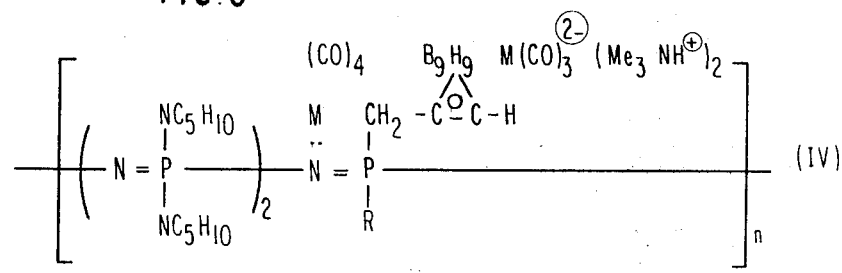

As set forth above, the carboranylmethylene-substituted cyclophosphazene of the formula (I)

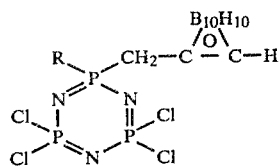

where R is $CH_3$, $C_2H_5$ or $n-C_3H$, acts differently from a carboranyl-substituted cyclophosphazene of the formula

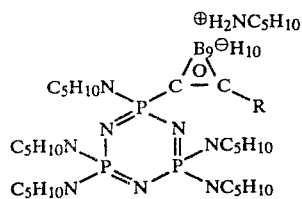

where the carboranyl group is attached directly to a phosphorus atom in the cyclophosphazene ring, in particular with respect to reaction with rhodium complexes such as $Rh(PPh_3)_3Cl$. More specifically, when the carboranylmethylene-substituted cyclophosphazene of the formula (I) is reacted with a cyclic amine such as piperidine, a compound of the formula

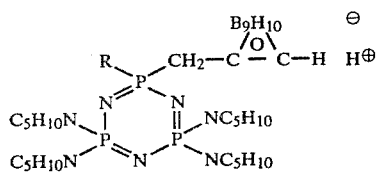

where R is $CH_3$, $C_2H_5$ or $n-C_3H_7$, arises which can be subsequently converted through a series of reactions resulting in complexation with $Rh(PPh_3)_3Cl$. Similarly, as will be described hereinafter, the formation of a rhodium complex with the polymer obtained from the carboranylmethylene-substituted cyclophosphazene of the formula (I) above by thermal polymerization to form the polymer (II) and subsequent conversion by reaction with piperidine followed by treatment with $Rh(PPh_3)_3Cl$, provides a class of metallophosphazene polymers useful as immobilized catalysts, for example, for the hydrogenation of olefins such as the butenes.

The carboranylmethylene-substituted cyclophosphazene of the formula (I), useful as a starting material in the production of the polymers of this invention, can be prepared in accordance with the following reaction Schematic A, where $R=CH_3$ is shown as being representative.

Schematic A

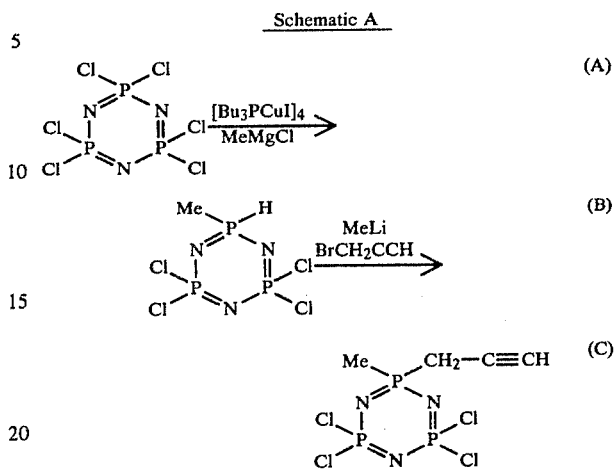

The starting material hexachlorocyclophosphazene of the formula (A) is a known starting material and is commercially available, e.g., from Ethyl Corporation and Nippon Fine Chemical (Inabata, Japan). This can be then reacted with $[Bu_3PCuI]_4$ in the presence of methylmagnesium chloride or bromide, followed by treatment with isopropyl alcohol to produce an intermediate, 1-methyl-1-hydrido-tetrachlorocyclotriphosphazene, of the formula (B).

Intermediate (B) can be then converted into an intermediate, 1-methyl-1-(1)-propynylcyclophosphazene, of the formula (C) by reaction of the 1-methyl-1-hydrido-tetrachlorocyclotriphosphazene (B) with propargyl bromide in the presence of methyllithium.

Upon reaction of the 1-methyl-1-(1)-propynyltetrachlorocyclotriphosphazene (C) with decaborane, a known compound, in acetonitrile and benzene, the carboranylmethylene-substituted cyclophosphazene of the formula (I) above can be thereby obtained. Following reaction Schematic A, analogous compounds corresponding to (B) and (C) above where R is $C_2H_5$ or $n-C_3H_7$ could be prepared by selecting the appropriate Grignard reagent.

As indicated above, the carboranylmethylene-substituted cyclophosphazene of the formula (I)

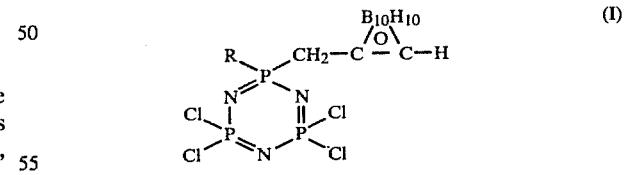

where R is as described above, can be then thermally polymerized into a polymer of the formula (II)

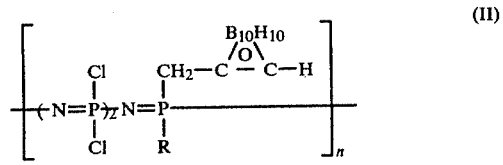

wherein R is as described above and n represents the degree of polymerization and ranges from 500 to 5000.

Similarly, the ethyl derivative or the n-propyl derivative, which could be prepared in an analogous manner to that described above for the methyl (Me) derivative of the formula (I) can be thermally polymerized into a formula similar to (II) where R is $C_2H_5$ or n-$C_3H_7$. It is only necessary to heat the cyclophosphazene of the formula (I) for thermal polymerization and a suitable thermal polymerization temperature can range from about 225° to about 300° C., preferably around 250° C.

Upon reaction with a cyclic amine, such as piperidine to replace the relatively reactive chlorine atoms attached to the phosphorus atoms in the polymer chain and thereby reduce reactivity, a polymer of the formula (IIa)

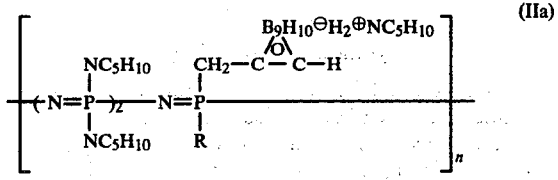

wherein R and n are as described above, is produced.

This polymer of the formula (IIa) wherein the reactive chlorine sites on the phosphorus atoms in the polymer chain have been replaced by piperidine groups can then be reacted with a rhodium complex such as Rh(PPh$_3$)$_3$Cl to produce a unique polymer of the formula (III)

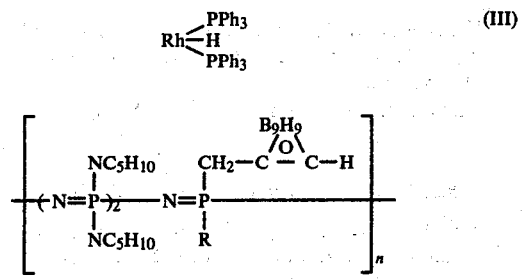

wherein R and n are also as described above.

The polymer of the formula (III) is considered to be useful as a catalyst for the hydrogenation of olefins such as the butenes. For example, a butene can be hydrogenated in the presence of a catalytic amount of the formula (III) at a temperature of about 30° C. to produce butanes.

Alternatively, the polymer of the formula (IIa) shown above in which the reactive chlorine atoms attached to the phosphorus atoms in the polymer chain have been replaced by piperidine rings, can be subsequently treated with sodium hydride to produce a polymer of the formula (IIb)

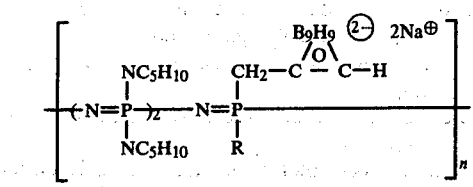

wherein R and n are as described above.

This polymer of the formula (IIb) is useful as an intermediate in the production of metallocarbonyl group containing polymers of the formula (IV)

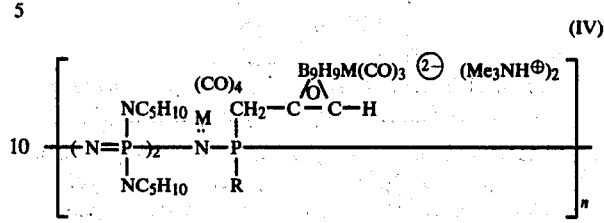

wherein R and n are as described above and M represents a transition metal such as molybdenum or tungsten.

This transformation of the polymer of the formula (IIb) into the polymer of the formula (IV) can be achieved in the presence of actinic radiation such as ultraviolet light utilizing the metal carbonyl compound desired for complexation with a polymer, such as M(CO)$_6$ where M is as described above, in the presence of trimethylammonium chloride.

The metallocarbonyl polymer of the formula (IV) shown above is considered to have unique applications in catalysis, e.g., polymerization of olefins such as the butenes as described for the polymer of the formula (III).

The various polymers (II)–(IV) set forth above are expected to be useful in the form of fibers, films, moldings or solvent-swelled gels.

As used herein, Me, Et, Pr, Bu and Ph are employed to represent methyl, ethyl, propyl, butyl and phenyl, respectively.

The following examples are given to illustrate the present invention in greater detail. However, these examples are not to be considered as limiting the scope of the present invention.

In all of the examples, the reactants employed were obtained as follows and the analytical determinations were also made as follows.

The benzene, piperidine, toluene, acetonitrile and triethylamine were dried by distillation from calcium hydride. The ethanol employed was distilled from magnesium chips. The isopropropanol was used as commercially obtained. The tetrahydrofuran was dried by distillation from a sodium benzophenone slurry. The triphosphazene [NPCl$_2$]$_3$ was commercially obtained and sublimed and recrystallized from hexane.

The propargyl bromide, Rh(PPh$_3$)$_3$Cl, methyllithium (2 M in tetrahydrofuran) and sodium hydride (50% dispersion in mineral oil) were commercially obtained and used as received. Similarly, the methylmagnesium chloride (3 M in tetrahydrofuran), W(CO)$_6$ and Mo(CO)$_6$ were used as received from commercial sources. The decaborane was also obtained commercially and sublimed prior to use.

Infrared spectra were obtained using a Perkin Elmer 580 grating spectrometer. $^{31}$P NMR spectra were recorded on a JEOL PS-100 FT NMR spectrometer. Microanalyses were performed by a commercial laboratory.

Unless otherwise indicated herein, all parts, percentages, ratios and the like are by weight.

EXAMPLE 1

Preparation of
1-Methyl-1-methylene-o-carboranyltetrachlorocyclotriphosphazene

Step 1—Synthesis of 1-Methyl-1-hydrido-tetrachlorocyclotriphosphazene (B) from Hexachlorocyclotriphosphazene (A)

Hexachlorocyclotriphosphazene (A) (5.0 g, 0.014 mol) and [n-Bu$_3$BuI]$_4$ (0.019 mol) were stirred together in tetrahydrofuran (150 ml) at $-80°$ C., and methylmagnesium chloride (10 ml of 3 M solution in tetrahydrofuran) was added dropwise over a period of about 30 min. The temperature was allowed to increase to 25° C. and the mixture was stirred for an additional 12 h. The mixture was then cooled to 0° C., and 2-propanol (10 ml) was added. Finally, removal of the solvent in vacuo and sublimation of the residue gave 1-methyl-1-hydridophosphazene (B) in up to 85% yield.

Step 2—Synthesis of 1-Methyl-1-(1-propynyl)tetrachlorocyclotriphosphazene (C)

1-Methyl-1-hydrido-tetrachlorocyclotriphosphazene (B) (6.9 g, 0.024 mol) produced as described in Step 1 above was dissolved in tetrahydrofuran (150 ml) and cooled to $-80°$ C. Methyllithium (0.019 mol, 9.5 ml of 2 M solution in tetrahydrofuran) was added dropwise over a period of about 45 min. The mixture was stirred for an additional 30 min. at $-80°$ C. and propargyl bromide (10 ml) was added over a period of about 30 min. The temperature was allowed to increase to 25° C. and the mixture was stirred for an additional 12 h. Finally, removal of the solvent and recrystallization of the residue from hot hexane gave 1-methyl-1-(1-propynyl)-tetrachlorotriphosphazene (C) in 70% yield.

Step 3—Synthesis of 1-Methyl-1-methylene-o-carboranyltetrachlorocyclotriphosphazene (I)

A solution of decaborane (2.8 g, 0.026 mol) in acetonitrile (30 ml) and benzene (150 ml) was boiled at reflux for 4 h. A white precipitate of bis(acetonitrile)-decaborane formed. To this refluxing solution, 1-methyl-(1-propynyl)tetrachlorocyclotriphosphazene (C) (4.40 g, 0.013 mol) produced as described in Step 2 above in benzene (50 ml) was added dropwise over a period of 1 h. The mixture was then stirred at reflux for an additional 24 h., and was cooled to room temperature. Removal of the solvent and recrystallization of the residue from hot hexane gave 1-methyl-1-methylene-o-carboranyl-tetrachlorocyclotriphosphazene (I) as white crystals in up to 90% yield, m.p. 186°–188° C. The mass spectrum of this compound (I) showed a parent peak at m/e=449 (mol. wt.≈449) with major peaks corresponding to the successive loss of four chlorine atoms.

Elemental Analysis Calcd (%): B, 24.08; C, 10.70; H, 3.57; P, 20.69; N, 9.35; Cl, 31.59. Found (%): B, 23.94; C, 10.73; H, 3.60; P, 19.97; N, 9.19; Cl, 31.03.

Infrared Analysis Peaks at 3060 cm$^{-1}$ (w) (C-H of the carborane), 2990–2900 cm$^{-1}$ (w) (C-H), 2590 and 2550 cm$^{-1}$ (s) (B-H), 1210 and 1180 cm$^{-1}$ (s) (P=N), 590 and 510 cm$^{-1}$ (s) (P-Cl).

$^{31}$P NMR Analysis An AB$_2$ pattern with A centered at 30.0 ppm and B at 19.0 ppm.

EXAMPLE 2

Thermal Polymerization of 1-Methyl-1-methylene-o-carboranyl-tetrachlorocyclotriphosphazene (I) to Polymer (II)

A 2 g portion of 1-methyl-1-methylene-o-carboranyl-tetrachlorocyclotriphosphazene (I) produced as in Example 1 above was placed in a 10×1 cm constricted Pyrex tube. Air was removed by vacuum for 5 h. at 0.05 Torr, and the contents were subjected to a melt-freeze evacuate cycle before the tube was sealed. The tube was then encased in a wire screen jacket and was heated in a thermoregulated oven at 250° C. for 6.5 h. A polymer containing repeating units of the formula (II) above was obtained.

EXAMPLE 3

Synthesis of Polymer (IIa)

A solution of 1.0 g (1.57×10$^{-3}$ mol) of Polymer (II) produced as described in Example 2 above in tetrahydrofuran (60 ml) was treated with piperidine (4.8×10$^{-2}$ mol) for 24 h. at 66° C. The solution turned white immediately, with some precipitation of polymer. An additional 70 ml of acetonitrile was added to the refluxing solution to redissolve the precipitated polymer, and the resulting solution was boiled at reflux for an additional 48 h. A granular polymer was obtained by precipitation of an acetonitrile solution of the product into water and benzene respectively to give Polymer (IIa). Polymer (IIa) was stable to water and was soluble in dimethylformamide, acetonitrile and tetrahydrofuran.

Elemental Analysis Calcd: B, 13.53; C, 48.45; H, 9.47; P, 12.95; N, 15.59. Found: B, 13.62; C, 48.52; H, 9.19; P, 12.93; N, 15.63.

The molecular weight (GPC) was found to be 1×10$^5$.

EXAMPLE 4

Reaction of Polymer (IIa) with Rh(PPh$_3$)$_3$Cl.

Polymer (IIa) (0.5 g, 7.8×10$^{-4}$ mol) produced as described in Example 3 and Rh(PPh$_3$)$_3$ (0.72 g, 7.8×10$^{-4}$ mol) were dissolved in dry, deoxygenated tetrahydrofuran (100 ml) and boiled at reflux for 24 h. The solution was cooled, concentrated, and granular Polymer (III) was obtained by precipitation into benzene. Polymer (III) was soluble in tetrahydrofuran, acetonitrile and dimethylformamide.

EXAMPLE 5

Reaction of Polymer (IIa) with NaH followed by M(CO)$_6$ (M=W, Mo).

Two solutions of Polymer (IIa) (1 g, 1.56×10$^{-3}$ mol) produced as described in Example 3 in 80 ml of tetrahydrofuran were added slowly to stirred suspensions of sodium hydride (3.6×10$^{-3}$ mol) in 50 ml of the same solvent. The reaction mixtures were stirred at reflux for 12 h. The solutions were allowed to cool, and the clear tetrahydrofuran solutions were decanted under nitrogen into two separate 250 ml quartz tubes.

One of the solutions was treated with Mo(CO)$_6$ (3.2×10$^{-3}$ mol).

The other of the solutions was treated with W(CO)$_6$ (3.2×10$^{-3}$ mol).

Both solutions were then irradiated with a Hanovia Type A-350-W mercury lamp for 48 h. The solutions turned yellow immediately with evolution of carbon monoxide. Each of the reaction mixtures was treated with a 200% excess of aqueous trimethylamine hydrochloride to precipitate polymers of the formula (IV) where M is W or Mo.

The granular polymers of the formula (IV) were collected by filtration, dried under vacuum, and stored in vacuum (2.05 Torr) at 25° C. to remove any free metal hexacarbonyls.

Infrared Analysis Absorptions at 3250 cm$^{-1}$ (m) (N-H), 2950 and 2850 cm$^{-1}$ (s) (C-H), 2500 cm$^{-1}$ (s) (B-H), 2150 (s), 2050 (w), 1990 (m), 1850 (s), 1825 (s) and 1800 (m) (C 0) and 1260 cm$^{-1}$ (s) (P=N).

$^{31}$P NMR Analysis

Two broad resonances at −9 ppm (P-(NC$_5$H$_{10}$)$_2$ and 12 ppm (carboranyl-P-CH$_3$ units).

EXAMPLE 6

In a manner analogous to the procedures described in Examples 1 to 5 above, compounds and polymers of the Formulas (I), (II), (III), (IV), (IIa) and (IIb) above could be obtained where R is C$_2$H$_5$ or n-C$_3$H$_7$ by using the appropriate ethyl or n-propyl Grignard reagent in Schematic A above for MeMgCl.

While the invention has been described in detail and with respect to specific embodiments thereof, it will be apparent to one skilled in the art that various changes and modifications can be made therein without departing from the spirit and scope thereof.

We claim:

1. A carboranylmethylene-substituted cyclophosphazene of the formula

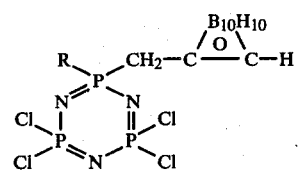

where R is CH$_3$, C$_2$H$_5$ or n-C$_3$H$_7$.

2. The cyclophosphazene of claim 1, wherein R is CH$_3$.

3. A polymer consisting of from 500 to 5000 repeating units of the formula

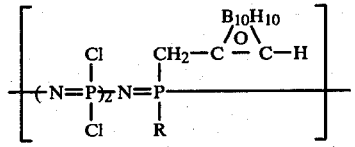

wherein R is CH$_3$, C$_2$H$_5$ or n-C$_3$H$_7$.

4. The polymer of claim 3 wherein R is CH$_3$.

5. A polymer consisting essentially of 500 to 5000 repeating units of the formula

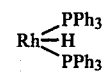
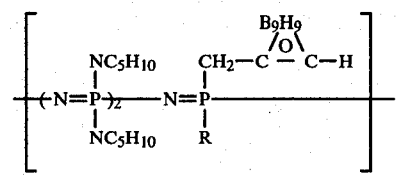

wherein R is CH$_3$, C$_2$H$_5$ or n-C$_3$H$_7$.

6. The polymer of claim 5, wherein R is CH$_3$.

7. A polymer consisting essential of from 500 to 5000 repeating units of the formula

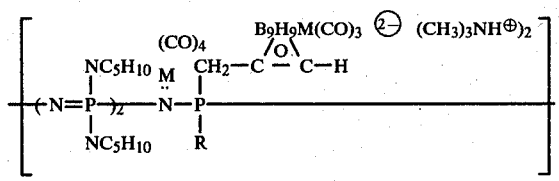

wherein R is CH$_3$, C$_2$H$_5$ or n-C$_3$H$_7$ and M is a transition metal.

8. The polymer of claim 7, wherein R is CH$_3$.

9. A polymer consisting essentially of 500 to 5000 repeating units of the formula

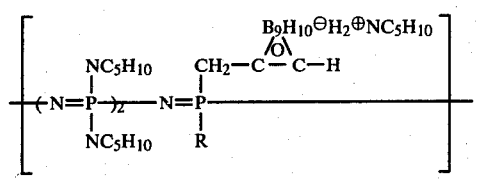

wherein R is CH$_3$, C$_2$H$_5$ or n-C$_3$H$_7$.

10. The polymer of claim 9, wherein R is CH$_3$.

11. A polymer consisting essentially of 500 to 5000 repeating units of the formula

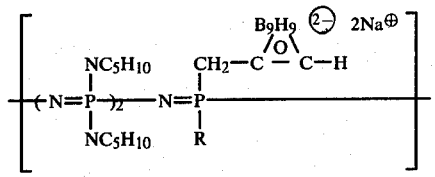

wherein R is CH$_3$, C$_2$H$_5$ or n-C$_3$H$_7$.

12. The polymer of claim 11 wherein R is CH$_3$.

* * * * *